United States Patent
West

(10) Patent No.: US 10,378,521 B1
(45) Date of Patent: Aug. 13, 2019

(54) SOLID ELECTROLYTE-BASED MICROTHRUSTERS

(71) Applicant: The United States of American as Represented by the Administrator of NASA, Washington, DC (US)

(72) Inventor: William C West, South Pasadena, CA (US)

(73) Assignee: United States of America as Represented by the Administrator of the National Aeronautics and Space Administration, Washington, DC (US)

(*) Notice: Subject to any disclaimer, the term of this patent is extended or adjusted under 35 U.S.C. 154(b) by 714 days.

(21) Appl. No.: 15/155,574

(22) Filed: May 16, 2016

(51) Int. Cl.
| F03H 1/00 | (2006.01) |
| C23C 14/14 | (2006.01) |
| C23C 14/06 | (2006.01) |
| C23C 14/58 | (2006.01) |
| B64G 1/40 | (2006.01) |

(52) U.S. Cl.
CPC .......... *F03H 1/0012* (2013.01); *B64G 1/405* (2013.01); *C23C 14/0623* (2013.01); *C23C 14/14* (2013.01); *C23C 14/5846* (2013.01)

(58) Field of Classification Search
CPC ........ F03H 1/0012; F03H 1/005; B64G 1/405
See application file for complete search history.

(56) References Cited

U.S. PATENT DOCUMENTS

| 3,620,018 A | 11/1971 | Banks |
| 5,845,880 A | 12/1998 | Petrosov et al. |
| 6,392,777 B1 | 5/2002 | Elliott et al. |
| 7,150,938 B2 | 12/2006 | Munshi et al. |
| 7,827,779 B1 | 11/2010 | Krishnan et al. |
| 8,850,792 B2 | 10/2014 | Marrese-Reading et al. |
| 9,194,379 B1 | 11/2015 | Biblarz et al. |
| 2002/0023427 A1 | 2/2002 | Mojarradi et al. |
| 2009/0120056 A1 | 5/2009 | Friedberger et al. |
| 2010/0018184 A1 | 1/2010 | Gilchrist et al. |
| 2010/0251690 A1* | 10/2010 | Kueneman ............ F03H 1/005 60/202 |
| 2011/0198004 A1 | 8/2011 | Banister et al. |
| 2012/0144796 A1 | 6/2012 | Marrese-Reading et al. |
| 2013/0098774 A1 | 4/2013 | Lozano et al. |
| 2014/0084115 A1 | 3/2014 | Sanchez et al. |
| 2014/0202131 A1 | 7/2014 | Boswell |
| 2014/0353397 A1 | 12/2014 | Velasquez-Garcia et al. |
| 2015/0076988 A1 | 3/2015 | Plettner et al. |

OTHER PUBLICATIONS

Paul J. Wilbur et al., "The Emissive Membrane Ion Thruster Concept" presented at the 29th International Electric Propulsion Conference, Princeton University, Oct. 31, 2005 to Nov. 4, 2005.

(Continued)

*Primary Examiner* — Gerald L Sung
*Assistant Examiner* — William L Breazeal

(57) ABSTRACT

A microthruster system may include a substrate and a source film. The substrate may include a plurality of emitter tips, and a source film deposited on the substrate. The source film may include silver. The microthruster system may also include a solid electrolyte film, which may include chalcogenide film, deposited over the source film. The solid electrolyte film may cause ions of the source film to move to the plurality of emitter tips.

22 Claims, 4 Drawing Sheets

(56) References Cited

OTHER PUBLICATIONS

Allan J. Cohen, "Experimental Investigation of a 2.5-Centimeter-Diameter" published by National Aeronautics and Space Administration, Washington DC, Feb. 1973.
Michael J. Patterson, "Ion Propulsion" published by National Aeronautics and Space Administration, Cleveland, Ohio, Jan. 11, 2016.

\* cited by examiner

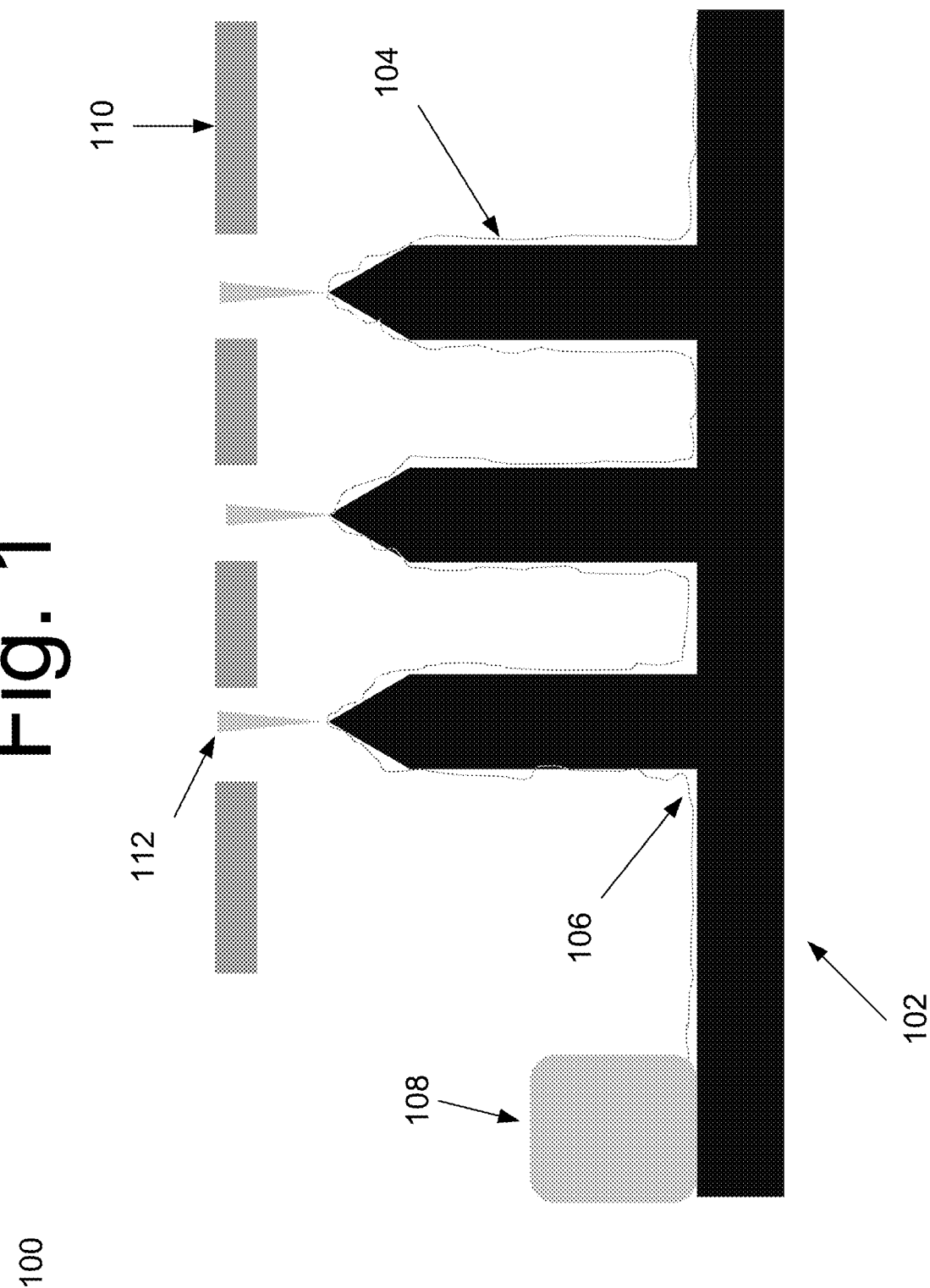

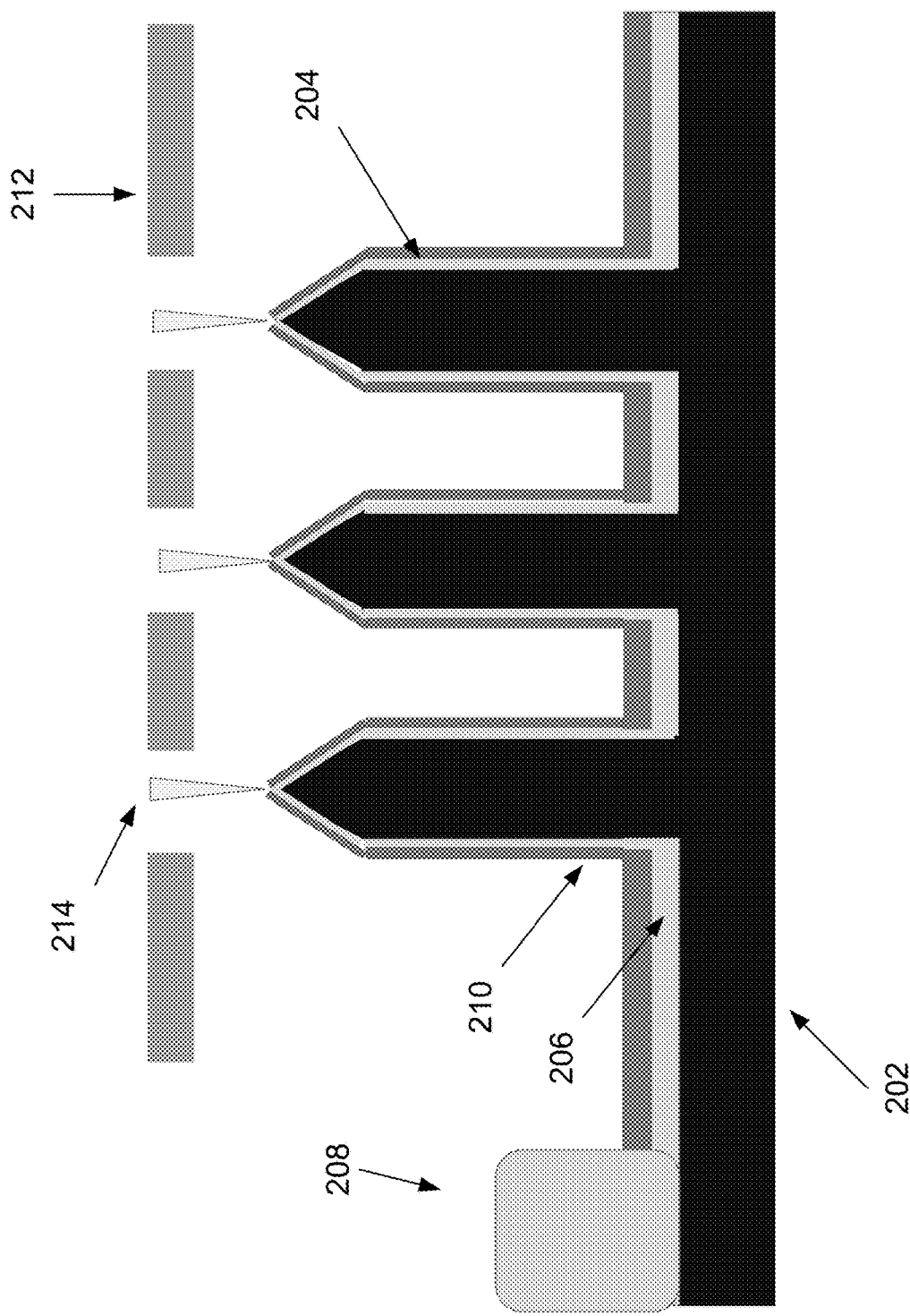

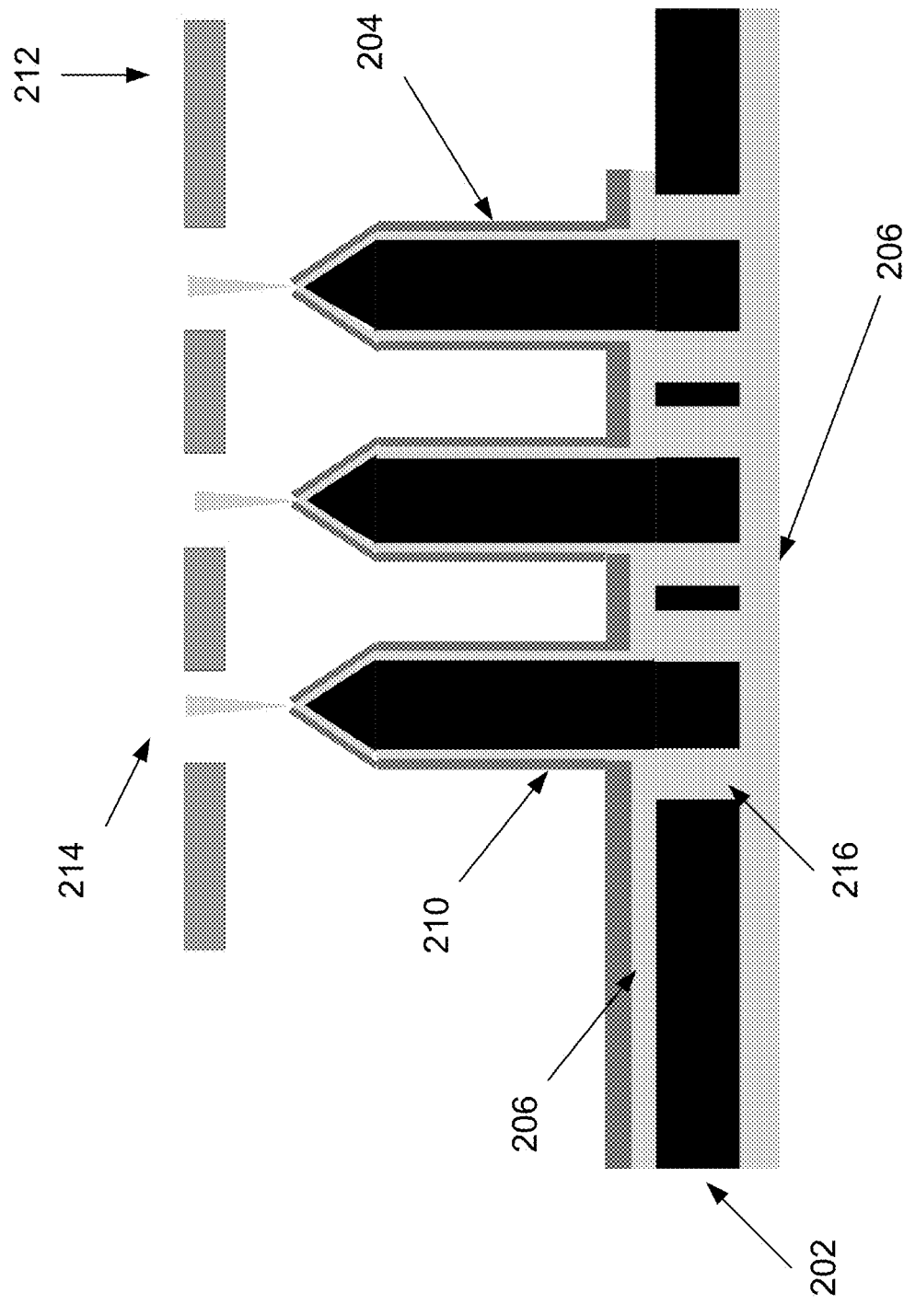

US 10,378,521 B1

SOLID ELECTROLYTE-BASED MICROTHRUSTERS

ORIGIN OF THE INVENTION

Embodiments of the present invention described herein were made in the performance of work under NASA contract NNN12AA01C and are subject to the provisions of Public Law #96-517 (35 U.S.C. § 202) in which the Contractor has elected not to retain title.

FIELD

The present invention generally pertains to microthrusters, and more particularly, to solid electrolyte-based microthrusters.

BACKGROUND

There are numerous designs for microthrusters. FIG. 1 is related art of a conventional microthruster system 100. In FIG. 1, indium reservoir 108 supplies indium (or molten indium) 106 as a fuel source when heated. Molten indium 106 of FIG. 1 flows across silicon substrate 102 and up to silicon emitter tips 104 creating indium emission plumes 112, which flow through extractor grids 110.

By using molten indium 106, droplets, indium ions, or mixtures thereof may be created depending on the voltage. Also, depending on the geometry of emitter tips 104, molten indium 106 will flow by way of capillarity.

Thus, rather than using indium, an alternative microthruster system with an alternative fuel source may be beneficial.

SUMMARY

Certain embodiments of the present invention may be implemented and provide solutions to the problems and needs in the art that are outside the capabilities of conventional sealing technologies. For instance, some embodiments pertain to a microthruster system that uses a solid electrolyte that serve as fast ion conductors for silver and copper.

In one embodiment, an apparatus includes a substrate with a plurality of emitter tips. The apparatus also includes a source film, which may include silver or copper, deposited on the substrate. The apparatus may further include a solid electrolyte film, which may include chalcogenide film, deposited over the source film. The solid electrolyte film may cause silver or copper ions of the source film to move to the plurality of emitter tips.

In another embodiment, microthruster system includes an electrolyte film coated on a solid metal film to move metal ions to a plurality of tips in a microthruster system. The electrolyte film coated on the solid metal film creates a covalently bonded chalcogenide electrolyte film.

In yet another embodiment, a process for fabricating a microthruster system includes depositing a solid metal film on a substrate of the microthruster system using thermal evaporation. The process also includes depositing an electrolyte film on the solid metal film. The deposited electrolyte film creates a covalently bonded chalcogenide electrolyte film to move metal ions within the solid metal film to a plurality of tips in a microthruster system.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 1 is related art of a conventional microthruster system 100.

FIGS. 2A and 2B illustrate a microthruster system, according to an embodiment of the present invention.

DETAILED DESCRIPTION OF THE EMBODIMENTS

Figure 3:
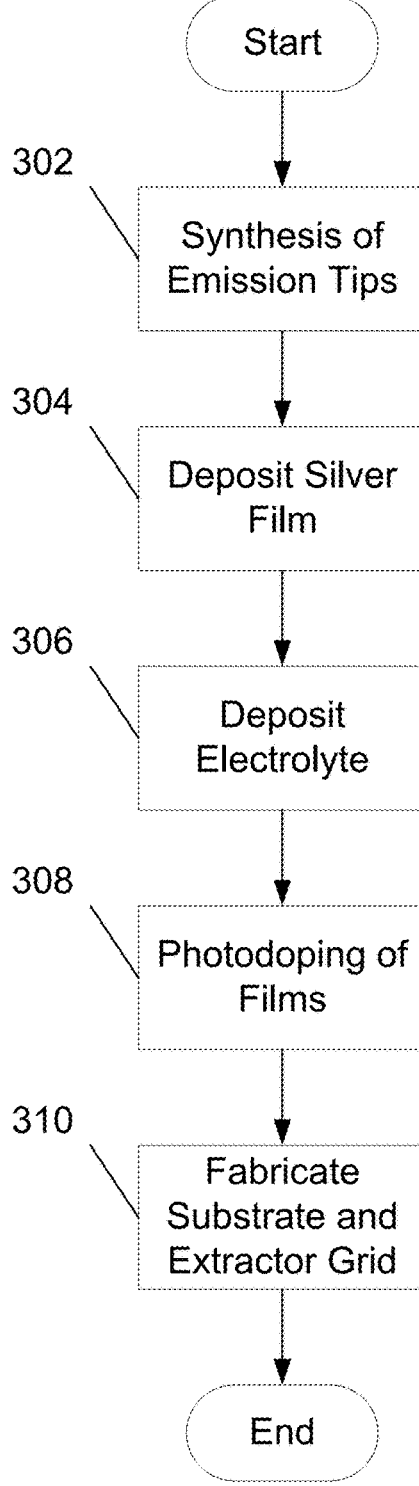
FIG. 3 is a flow diagram illustrating a process of fabricating the microthruster system, according to an embodiment of the present invention.

There is significant interest in highly controllable in-space micro-scale thrusters for a wide range of applications including formation flying. Some of the embodiments generally pertain to a solid-electrolyte based microthruster system (the "microthruster system") that is highly controllable and functions at high mass-to-charge ratio. The microthruster system may significantly reduce temperatures and power levels relative to other electrospray systems such as liquid metal-based microthrusters.

In some embodiments, the microthruster system may include an electrolyte film coated on a solid metal fuel reservoir film to move metal ions, rather than moving molten metal and capillary forces, to tips of the microthruster. In certain embodiments, the electrolyte film coated on the reservoir film creates covalently bonded solid chalcogenide electrolyte films. The covalently bonded solid chalcogenide electrolyte films may be vacuum compatible and may allow for facile transport of silver ions near room temperature, approaching liquid-like conductivities. These materials have previously found application in low power non-volatile memory systems by way of high speed transport of silver ions between electrodes through the solid electrolyte. The transport and subsequent emission of silver ions from the solid metal reservoir through the solid electrolyte by the electric field imposed by the extractor grid is easily controlled, without the need for complex solid-liquid capillary force management.

FIG. 2A illustrates a microthruster system 200A, according to an embodiment of the present invention. In some embodiments, microthruster system 200 includes a silicon substrate 202 and silicon emitter tips 204. Microthruster system 200 also includes a solid electrolyte 210 that serves as fast ion conductors to move either silver or copper. In some embodiments, solid electrolyte 210 may include chalcogenide. It should be appreciated that solid electrolyte 210 does not have to be heated, or required to be at a predefined temperature, to move the silver ions or copper ions.

For purposes of explanation, silver will be used as an example. In order to move the silver, a silver film 206 is deposited on silicon substrate 202, and solid electrolyte 210 is deposited on silver film 206. In some embodiments, silver reservoir 208 may be used to supply the silver in silver film 206. However, in other embodiments such as that shown in FIG. 2B, silver film 206 may be on top of, and on bottom of, silicon substrate 202 in microthruster system 200B. In those embodiments, silicon substrate 202 may be perforated to include gaps or holes 216. The perforated gaps or holes 216 may be filled with silver. During operation, the silver ions may be transported up to silicon emitter tips 204 generating silver emission plume 214 through extractor grid 212.

Using this configuration, transport of fuel is weakly dependent on the geometry of silicon emitter tip 204, reducing tip-to-tip thrust variability. Furthermore, the transport of fuel does not depend on heating above the melting point of the metal, since the fuel is not molten.

It should be appreciated that in some embodiments the silver ions are moving in response to an electric field and electric chemical potential gradient, rather than capillary. This way, silicon emitter tips 204 do not have to be nearly identical to one another, which is a requirement for microthruster system 100.

During operation, the transport of silver ions is driven by electrochemical potential that is easily controllable. Furthermore, by transporting silver ions from silver reservoir 208 to silicon emitter tip 204, the transportation of silver ions is more efficient having a transference number of 1.0. Unlike microthruster system 100, where droplets of indium are emitted, emission plumes 214 may only include silver ions. This way, the thrust to power ratio may be extremely high, unlike the thrust to power ratio from microthruster system shown in FIG. 1.

FIG. 3 is a flow diagram illustrating a process 300 of fabricating the microthruster system, according to an embodiment of the present invention. In some embodiments, the process may begin at 302 with synthesis or procurement of arrays of emission tips on silicon wafers. At 304, thermal evaporation is used to deposit silver source films, and at 306, thermal evaporation is used to deposit solid electrolyte chalcogenide films, such as $GeS_2$ or $As_2S_3$, over the silver source film. In other embodiments, sputtering may be used to deposit the solid electrolyte chalcogenide films over the silver source films. At 308, photo-doping of chalcogenide/silver films by exposure to ultraviolet (UV) light. It should be appreciated that photo-doping allows for the simplicity of preparing the solid electrolyte, i.e., a solid solution of the chalcogenide+silver or copper (e.g., $As_2S_3Ag_{2.4}$). This composition may be difficult to prepare by most thin film deposition techniques, since the components may have differing vapor pressures. However, the process of photo-doping allows for separate deposition of the chalcogenide (e.g., $Ag_2S_3$) and the silver or copper film). Both materials may be easily prepared by thermal evaporation in some embodiments. Further, by exposing the chalcogenide-metal bi-layer structure to light, the reaction (photo-diffusion) of the metal is driven into the chalcogenide to make the solid electrolyte. Simply put, while the solid electrolyte may be directly deposited on the metal film, photo-doping may simplify the process even further in some embodiments. At 310, a substrate and extractor grid test assemblies are fabricated above the emitter tips.

Embodiments described herein may obviate the need for any heating of the fuel reservoir or transport of the liquid metals, greatly simplifying the design of the microthruster system while also reducing energy consumption. In some embodiments, heating may be used when, for example, the microthruster's temperature is less than 0 degrees Celsius. Also, in some embodiments, since silver ions are transported and emitted at a 1:1 ratio of ions:electrons rather than clusters of ions and droplets in liquid metal microthrusters, the emission characteristics is much more controllable by way of throttling current and emitter electric field. These low power, highly controllable microthrusters may provide the unique capability for in-space precision propulsion for a wide range of missions.

It will be readily understood that the components of various embodiments of the present invention, as generally described and illustrated in the figures herein, may be arranged and designed in a wide variety of different configurations. Thus, the detailed description of the embodiments, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:
1. An apparatus, comprising:
a substrate with a plurality of emitter tips;
a source film, comprising silver or copper, deposited on the substrate; and
a solid electrolyte film, comprising chalcogenide film, deposited over the source film, wherein
the solid electrolyte film causes silver or copper ions within the source film to move towards the plurality of emitter tips.

2. The apparatus of claim 1, further comprising:
   a reservoir comprising silver or copper is used to supply the silver or copper ions from the source film to the plurality of emitter tips.

3. The apparatus of claim 1, wherein the source film is on top of the substrate, on bottom of the substrate, or both.

4. The apparatus of claim 1, wherein the substrate comprises a plurality of perforated holes.

5. The apparatus of claim 4, wherein each of the plurality of perforated holes is filled with silver or copper to allow the silver or copper ions to be transported up to the plurality of emitter tips, generating a silver or copper emission plume through an extractor grid.

6. The apparatus of claim 1, wherein the silver or copper ions move in response to an electric field, an electric chemical potential gradient, or both.

7. The apparatus of claim 1, wherein at least two of the plurality of emitter tips are identical.

8. A microthruster system, comprising:
   an electrolyte film coated on a solid metal film to move metal ions to a plurality of tips in the microthruster system, wherein
   the electrolyte film coated on the solid metal film creates a covalently bonded chalcogenide electrolyte film.

9. The microthruster system of claim 8, wherein the covalently bonded chalcogenide electrolyte film is vacuum compatible, and allows for transport of metal ions near room temperature, approaching liquid-like conductivities.

10. The microthruster system of claim 8, wherein the solid metal film comprises silver or copper.

11. The microthruster system of claim 8, further comprising:
    a solid metal reservoir connected to the solid metal film, and supplies the metal ions from the solid metal reservoir to the plurality of emitter tips.

12. The microthruster system of claim 8, wherein the solid metal film is on top of a substrate of the microthruster system, on bottom of the substrate of the microthruster system, or both.

13. The microthruster system of claim 12, wherein the substrate of the microthruster system comprises a plurality of perforated holes.

14. The microthruster system of claim 13, wherein each of the plurality of perforated holes is filled with metal to allow the metal ions to be transported to the plurality of emitter tips, generating an emission plume through an extractor grid.

15. The apparatus of claim 8, wherein the metal ions move in response to an electric field, an electric chemical potential gradient, or both.

16. The microthruster system of claim 13, wherein at least two of the plurality of emitter tips are identical.

17. A process for fabricating a microthruster system, comprising:
    depositing a solid metal film on a substrate of the microthruster system using thermal evaporation;
    depositing an electrolyte film on the solid metal film, wherein the depositing of the electrolyte film creates a covalently bonded chalcogenide electrolyte film to move metal ions within the solid metal film to a plurality of tips in the microthruster system.

18. The process of claim 17, wherein thermal evaporation is used to deposit the electrolyte film on the solid metal film.

19. The process of claim 18, wherein sputtering is used to deposit the electrolyte film on the solid metal film.

20. The process of claim 17, further comprising:
    photo-doping of the electrolyte film and the solid metal film by exposure to ultraviolet light.

21. The apparatus of claim 1, wherein at least two of the plurality of emitter tips vary in one or more of size and shape.

22. The microthruster system of claim 13, wherein at least two of the plurality of emitter tips vary in one or more of size and shape.

* * * * *